US006717537B1

(12) United States Patent

Fang et al.

(10) Patent No.: US 6,717,537 B1

(45) Date of Patent: Apr. 6, 2004

(54) METHOD AND APPARATUS FOR MINIMIZING LATENCY IN DIGITAL SIGNAL PROCESSING SYSTEMS

(75) Inventors: Xiaoling Fang, Irvine, CA (US); Keith L. Davis, Salt Lake City, UT (US); Martin R. Johnson, Draper, UT (US)

(73) Assignee: Sonic Innovations, Inc., Salt Lake City, UT (US)

( * ) Notice: Subject to any disclaimer, the term of this patent is extended or adjusted under 35 U.S.C. 154(b) by 0 days.

(21) Appl. No.: 10/179,930

(22) Filed: Jun. 24, 2002

Related U.S. Application Data

(60) Provisional application No. 60/301,308, filed on Jun. 26, 2001.

(51) Int. Cl.[7] .......................... H03M 3/00

(52) U.S. Cl. .......................... 341/143; 381/74

(58) Field of Search .......................... 341/143, 155, 341/144; 381/94, 55, 92

(56) References Cited

U.S. PATENT DOCUMENTS

| | | | | |
|---|---|---|---|---|
| 4,025,721 | A | 5/1977 | Graupe et al. | 179/1 P |
| 4,122,303 | A | 10/1978 | Chaplin et al. | 179/1 P |
| 4,185,168 | A | 1/1980 | Graupe et al. | 179/1 P |
| 4,249,128 | A | 2/1981 | Karbowski | 324/329 |
| 4,309,570 | A | 1/1982 | Carver | 179/1 G |
| 4,423,442 | A | 12/1983 | Bitting et al. | 360/68 |
| 4,432,299 | A | 2/1984 | Smith | 116/137 R |
| 4,455,675 | A | 6/1984 | Bose et al. | 381/74 |
| 4,473,906 | A | 9/1984 | Warnaka et al. | 381/71 |
| 4,494,074 | A | 1/1985 | Bose | 330/109 |
| 4,589,133 | A | 5/1986 | Swinbanks | 381/71 |
| 4,603,429 | A | 7/1986 | Carver | 381/1 |
| 4,622,660 | A | 11/1986 | Cowans et al. | 369/134 |
| 4,644,581 | A | 2/1987 | Sapiejewski | 381/74 |
| 4,654,871 | A | 3/1987 | Chaplin et al. | 381/72 |
| 4,658,932 | A | 4/1987 | Billingsley | 181/175 |
| 4,731,850 | A | 3/1988 | Levitt et al. | 381/68.2 |
| 4,736,751 | A | 4/1988 | Gevins et al. | 128/732 |

(List continued on next page.)

FOREIGN PATENT DOCUMENTS

| | | | |
|---|---|---|---|
| WO | WO 94/11953 | 5/1994 | |
| WO | WO 98/43567 | 8/1998 | A61F/11/06 |

OTHER PUBLICATIONS

Saunders, et al., "A Hybrid Structural Control Approach for Narrow–Band and Impulsive Disturbance Rejection", 1996, Noise Control Eng. J., vol. 44, No. 1, pp 11–21.

PCT International Search Report, PCT/US 02/20223, International filing date Jun. 25, 2002, date Search Report mailed Apr. 25, 2003.

*Primary Examiner*—Jean Bruner JeanGlaude
*Assistant Examiner*—Joseph Lauture
(74) *Attorney, Agent, or Firm*—Thelen Reid & Priest LLP; Steven J. Robbins

(57) ABSTRACT

A method and an apparatus for minimizing latency in digital signal processing paths. One example is an active noise cancellation device. The system includes a digital closed feedback loop having a forward path and a feedback path. The forward path includes a compensation filter, a digital-to-analog converter, and an output transducer. The feedback path includes an input transducer, a feedback delta-sigma modulator, and a feedback sampling-rate converter. An input signal is processed in one of several ways into a processed digital input signal having a preselected intermediate sampling rate. Through the feedback path, an analog output signal is processed into a digital feedback signal having substantially the same preselected intermediate sampling rate. The processed digital input signal and the digital feedback signal are combined and processed through the forward path to produce an anti disturbance signal that is combined with a disturbance signal to form the analog output signal.

19 Claims, 6 Drawing Sheets

U.S. PATENT DOCUMENTS

| | | | | | |
|---|---|---|---|---|---|
| 4,783,818 | A | | 11/1988 | Graupe et al. | 381/71 |
| 4,827,280 | A | | 5/1989 | Stamer et al. | 346/1.1 |
| 4,833,719 | A | | 5/1989 | Carme et al. | 381/72 |
| 4,868,870 | A | | 9/1989 | Schrader | 381/96 |
| 4,878,188 | A | | 10/1989 | Ziegler, Jr. | 364/724.01 |
| 4,879,749 | A | | 11/1989 | Levitt et al. | 381/68.4 |
| 4,905,090 | A | | 2/1990 | Miyake | 358/296 |
| 4,922,542 | A | | 5/1990 | Sapiejewski | 381/187 |
| 4,939,600 | A | | 7/1990 | Desai et al. | 360/78.04 |
| 4,953,217 | A | | 8/1990 | Twiney et al. | 381/72 |
| 4,985,925 | A | | 1/1991 | Langberg et al. | 381/72 |
| 5,001,763 | A | | 3/1991 | Moseley | 381/71 |
| 5,083,538 | A | | 1/1992 | Hubbell | 123/198 E |
| 5,105,377 | A | | 4/1992 | Ziegler, Jr. | 364/724.01 |
| 5,107,379 | A | | 4/1992 | Huber | 360/46 |
| 5,109,410 | A | | 4/1992 | Suhami et al. | 379/430 |
| 5,159,639 | A | | 10/1992 | Shannon et al. | 381/68.5 |
| 5,164,984 | A | | 11/1992 | Suhami et al. | 379/444 |
| 5,177,755 | A | | 1/1993 | Johnson | 372/38 |
| 5,181,252 | A | | 1/1993 | Sapiejewski et al. | 381/187 |
| 5,182,774 | A | | 1/1993 | Bourk | 381/71 |
| 5,222,189 | A | | 6/1993 | Fielder | 395/2 |
| 5,251,263 | A | | 10/1993 | Andrea et al. | 381/71 |
| 5,259,033 | A | | 11/1993 | Goodings et al. | 381/68 |
| 5,267,321 | A | | 11/1993 | Langberg | 381/72 |
| 5,276,739 | A | | 1/1994 | Krokstad et al. | 381/68.2 |
| 5,287,398 | A | | 2/1994 | Briault | 379/38 |
| 5,361,303 | A | | 11/1994 | Eatwell | 381/71 |
| 5,363,444 | A | | 11/1994 | Norris | 379/430 |
| 5,381,485 | A | | 1/1995 | Elliott | 381/71 |
| 5,402,497 | A | | 3/1995 | Nishimoto et al. | 381/95 |
| 5,452,361 | A | | 9/1995 | Jones | 381/71 |
| 5,481,615 | A | | 1/1996 | Eatwell et al. | 381/71 |
| 5,497,426 | A | | 3/1996 | Jay | 381/67 |
| 5,523,715 | A | | 6/1996 | Schrader | 330/10 |
| 5,539,831 | A | | 7/1996 | Harley | 381/67 |
| 5,600,729 | A | | 2/1997 | Darlington et al. | 381/71 |
| 5,602,928 | A | | 2/1997 | Eriksson et al. | 381/71 |
| 5,604,813 | A | | 2/1997 | Evans et al. | 381/71 |
| 5,610,987 | A | | 3/1997 | Harley | 381/67 |
| 5,638,022 | A | | 6/1997 | Eatwell | 327/551 |
| 5,727,566 | A | | 3/1998 | Leight | 128/857 |
| 5,793,875 | A | | 8/1998 | Lehr et al. | 381/68.1 |
| 5,815,582 | A | | 9/1998 | Claybaugh et al. | 381/71.6 |
| 5,848,169 | A | | 12/1998 | Clark, Jr. et al. | 381/71.13 |
| 5,850,453 | A | | 12/1998 | Klayman et al. | 381/1 |
| 5,937,070 | A | | 8/1999 | Todter et al. | 381/71.6 |
| 5,965,850 | A | | 10/1999 | Fraser | 181/129 |
| 5,990,818 | A | | 11/1999 | McGrath | 341/141 |
| 5,999,631 | A | * | 12/1999 | Porayath et al. | 381/93 |
| 6,072,884 | A | | 6/2000 | Kates | 381/318 |
| 6,078,672 | A | | 6/2000 | Saunders et al. | 381/71.6 |
| 6,118,878 | A | | 9/2000 | Jones | 381/72 |
| 6,160,893 | A | | 12/2000 | Saunders et al. | 381/71.6 |
| 6,163,610 | A | | 12/2000 | Bartlett et al. | 379/433 |
| 6,173,063 | B1 | | 1/2001 | Melanson | 381/318 |
| 6,181,801 | B1 | | 1/2001 | Puthuff et al. | 381/380 |
| 6,208,279 | B1 | | 3/2001 | Oprescu | 341/143 |
| 6,219,427 | B1 | | 4/2001 | Kates et al. | 381/318 |
| 6,278,786 | B1 | | 8/2001 | McIntosh | 381/71.6 |
| 6,339,647 | B1 | * | 1/2002 | Andersen et al. | 381/312 |
| 6,373,953 | B1 | * | 4/2002 | Flaks | 381/94.7 |
| 6,396,930 | B1 | | 5/2002 | Vaudrey et al. | 381/60 |

* cited by examiner

METHOD AND APPARATUS FOR MINIMIZING LATENCY IN DIGITAL SIGNAL PROCESSING SYSTEMS

RELATED US PATENT APPLICATION DATA

The present non-provisional patent application claims the benefit of U. S. provisional patent application Ser. No. 60/301,308, filed on Jun. 26, 2001.

FIELD OF THE INVENTION

The present invention is generally directed to digital signal processing. More specifically, the present invention is directed to minimization of system latency in signal processing paths including digital control loops.

BACKGROUND OF THE INVENTION

The use of digital signal processing for communication systems, such as cable and satellite transmission systems, has long been known in the art. Presently, these digital communications are in widespread use in establishing links between nearly all types of communication devices in which two or more such devices are in need of high quality communication with one another. As a result, these systems allow for the utilization of sophisticated communication applications in which each member can communicate with other members and other devices. Such digital signal processing devices have been developed in a the intended use. One form of digital signal processing device in use today in communication systems is an active noise cancellation (ANC) device. The ANC-device is most often used in a sound environment where there are one or more disturbance or noise signals that tend to obscure the desired or target signal. The conventional ANC device generally includes a feedback circuit which uses an input transducer such as a microphone to detect ambient noise and an output transducer such as a loudspeaker or receiver to both generate an antinoise signal to cancel the ambient noise and to deliver the desired signal. The particular circuit elements vary from implementation to implementation.

Currently, ANC is achieved in analog form by introducing a canceling antinoise signal. The actual noise is detected through one or more microphones. An antinoise signal of equal amplitude and opposite phase is generated and combined with the actual noise. If done properly, this should result in cancellation of both noises. The amount of noise cancellation depends upon the accuracy of the amplitude and phase of the generated antinoise signal. ANC can be an effective method of attenuating low-frequency noise which can prove to be very difficult and expensive to control using passive noise control techniques.

Turning first to FIG. 1, a block diagram of a first prior art feedback active noise cancellation system 10 as disclosed in U.S. Pat. No. 4,455,675 and 4,644,581 is shown. The system 10 has as input a desired signal and a Noise signal and generates an output signal. For discussion purposes, it will be assumed that the desired signal is an input voice (Vin) signal and that the output signal is an output voice (Vout) signal. The Noise signal is considered to be any disturbance signal in the sound environment other than the desired signal. The Vout signal is a combination of the Vin signal, the Noise signal, and an antinoise signal generated by the system 10. As noted above, in theory the antinoise signal exactly cancels the Noise signal leaving only the Vin signal without attenuation as the Vout signal. In fact, this is not always the result. The system 10 attempts to achieve as high a gain as possible in the overall loop within a predetermined frequency range while maintaining the system stability. The forward path of the system 10 includes a compressor 12, a compensator 14, a power amplifier 16, and a receiver 18. For example, the receiver 18 could be any output transducer including a loudspeaker. The feedback path of the system 10 includes a microphone 20 as an input transducer and a microphone preamplifier 22. The Vin signal and the feedback path signal are combined in a first summation node 24. The forward path signal and the Noise signal are combined in a second summation node 26.

Turning now to FIG. 2, a block diagram of a second prior art feedback active noise cancellation system 30 as disclosed in U.S. Pat. No. 5,182,774 is shown. One will note that the system 30 has similarities with the system 10 of FIG. 1 except that the forward path includes a high-pass filter 32, a low-pass filter 34, and a mid-range filter 36 in combination with the receiver 18. Further, the feedback path adds a high-pass filter 38 to the microphone 20 and the microphone preamplifier 22.

Turning now to FIG. 3, a block diagram of a third prior art feedback active noise cancellation system 40 as disclosed in U.S. Pat. No. 5,604,813 is shown. In this case, a boost circuit 42 has been added outside of the closed loop, that is, before the first summation node 24, to equalize the desired signal. The feedback path of the system 40 includes the microphone 20, a plurality of band-pass filters 44, and a low-pass filter 46.

While widely used in the art, the conventional analog approach for reducing noise in a system is not without its problems. ANC systems are theoretically able to null the noise by generating a phase-inverted antinoise signal, however, as a practical concern, the various components of the system such as the input and output transducers will introduce certain undesirable delays. These delays may adversely affect the frequency range over which noise can be cancelled, the degree to which noise can be cancelled, and the stability of the noise-cancellation system. It is therefore desirable to be able to minimize the associated delays in the circuit. Likewise, it is also desirable to be able to adjust the circuit to compensate for component variation and manufacturing tolerances and for usage conditions to maximize the noise-cancellation frequency range and noise-cancellation ratio. Such adjustability is difficult to achieve using analog techniques. Another desirable function that can prove difficult in the analog domain is the equalization of the signal for frequency-dependent attenuation caused by subsequent processing functions.

BRIEF DESCRIPTION OF THE INVENTION

A method and an apparatus for minimizing latency in digital signal processing paths is disclosed. One example is an active noise cancellation device. The system includes a digital closed feedback loop having a forward path and a feedback path. The forward path includes a compensation filter, a digital-to-analog converter, and an output transducer. The feedback path includes an input transducer, a feedback delta-sigma modulator, and a feedback sampling-rate converter. An input signal is processed in one of several ways into a processed digital input signal having a preselected intermediate sampling rate. Through the feedback path, an analog output signal is processed into a digital feedback signal having substantially the same preselected intermediate sampling rate. The processed digital input signal and the digital feedback signal are combined and processed through the forward path to produce an anti disturbance signal that is combined with a disturbance signal to form the analog output signal.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION OF THE INVENTION

Various exemplary embodiments of the present invention are described herein in the context of a method and an apparatus for minimizing latency in digital signal processing paths. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
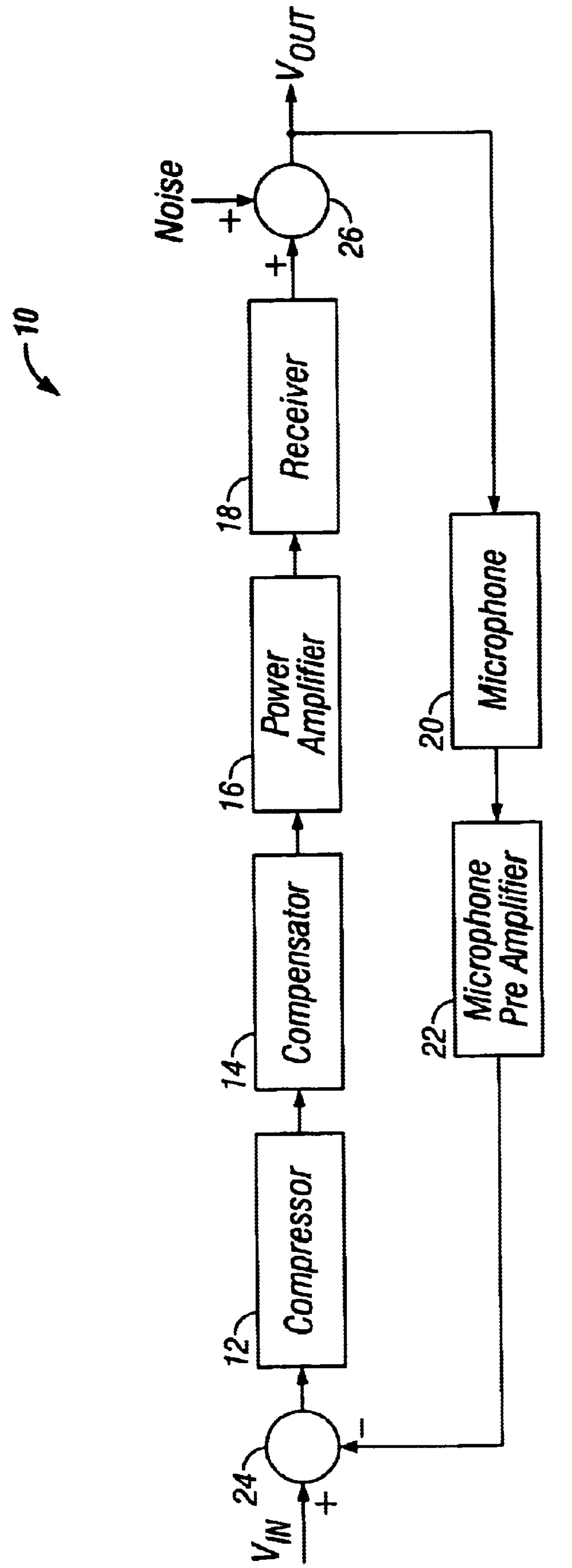
FIG. 1 (Prior Art)
FIG. 1 is a block diagram of a first prior art feedback active noise cancellation system.
Figure 2:
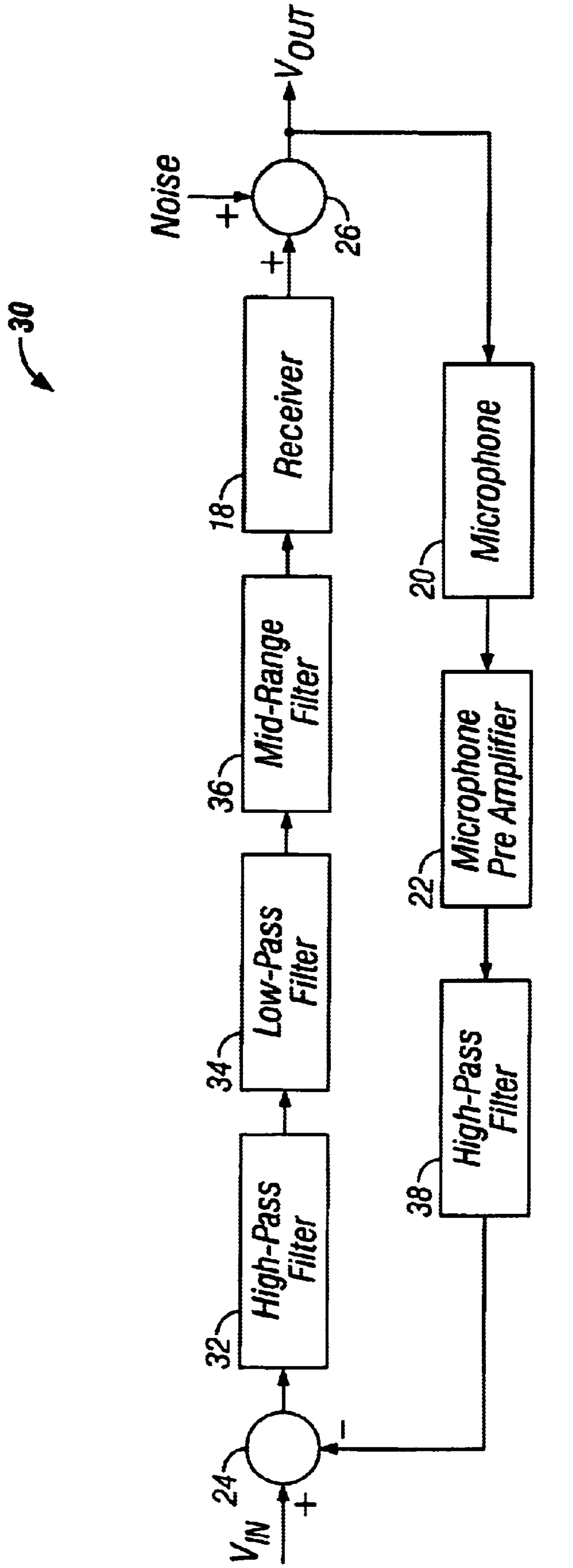
FIG. 2 (Prior Art)
FIG. 2 is a block-diagram of a second prior art feedback active noise cancellation system.
Figure 3:
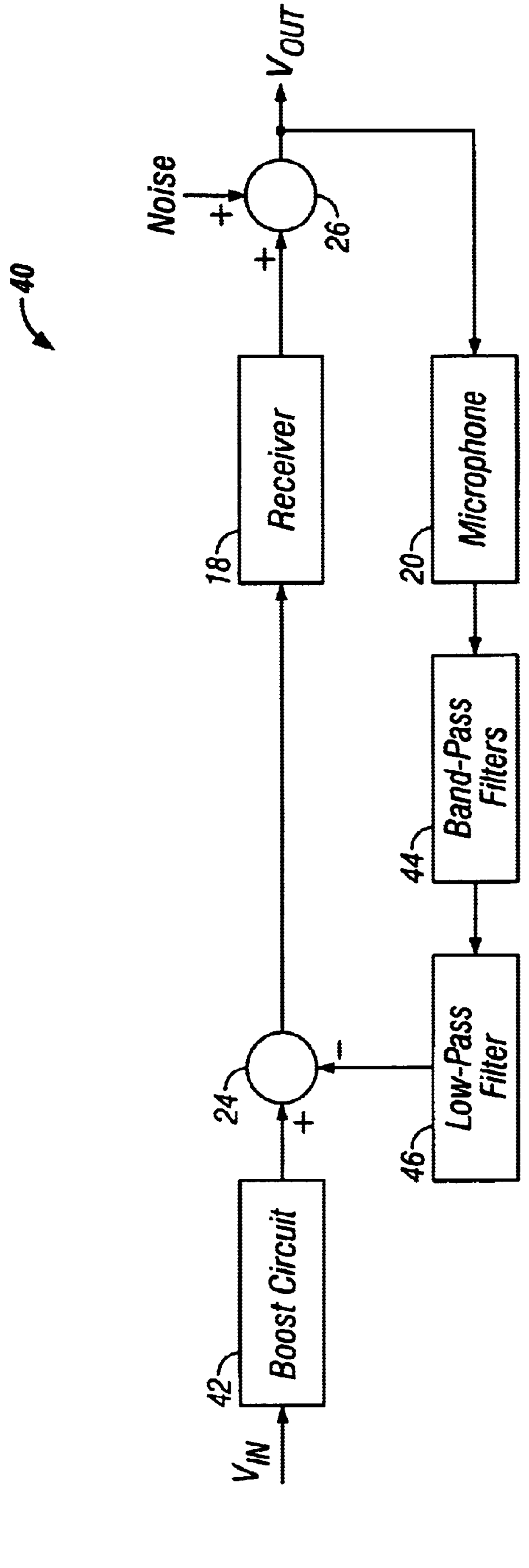
FIG. 3 (Prior Art)
FIG. 3 is a block diagram of a third prior art feedback active noise cancellation system.
Figure 4:
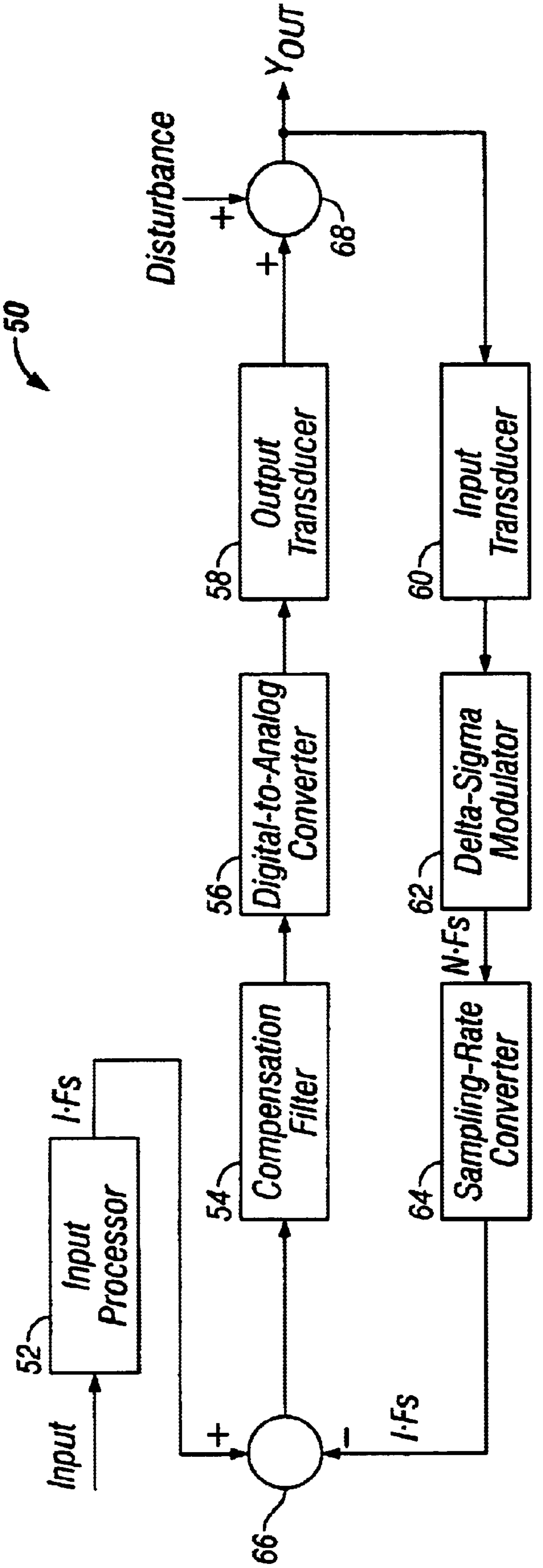
FIG. 4 is a block diagram of an exemplary embodiment of a feedback active noise cancellation system according to the present invention.

Turning now to FIG. 4, a block diagram of an exemplary embodiment of a feedback active noise cancellation system 50 according to the present invention is shown. Outside of the closed loop, the system 50 includes an input processor 52. The details of the input processor 52 will be discussed in more detail below. In general, the input processor 52 takes an INPUT signal, either analog or digital, and produces a processed digital input signal having an intermediate (I) sampling rate equal to I times Fs where I has a value greater than one and Fs is the sampling rate which is twice the Nyquist rate (Finax) of the INPUT signal. The forward path includes a compensation filter 54, a digital-to-analog converter (DAC) 56, and an output transducer 58. The result of the forward path is an analog forward path signal. The feedback path includes an input transducer 60, a feedback delta-sigma modulator 62, and a feedback sampling-rate converter 64. The output of the feedback delta-sigma modulator 62 has a sampling rate equal to N times Fs where N is greater than one. N is also greater than I. However, since IFs is the desired sampling rate, the output NFs needs to be down-sampled to the lower rate by the feedback sampling-rate converter 64. The result is a digital feedback signal that has the same sampling rate as the processed digital input signal. The intermediate sampling rate is chosen to produce an acceptably low delay in the feedback path. The tradeoff is increased circuit complexity and cost. The digital feedback signal is subtracted from the processed digital input signal at a first summation node 66. It is also possible to combine the feedback delta-sigma modulator 62 and the feedback sampling-rate converter 64 into a feedback analog-to-digital converter (ADC) with an output rate of IFs. The analog forward path signal is combined with an analog DISTURBANCE signal in a second summation node 68. The output of the second summation node 68 is the input of the feedback path and the output of the system 50 and is an analog acoustic output signal (Vout).

Figure 5:
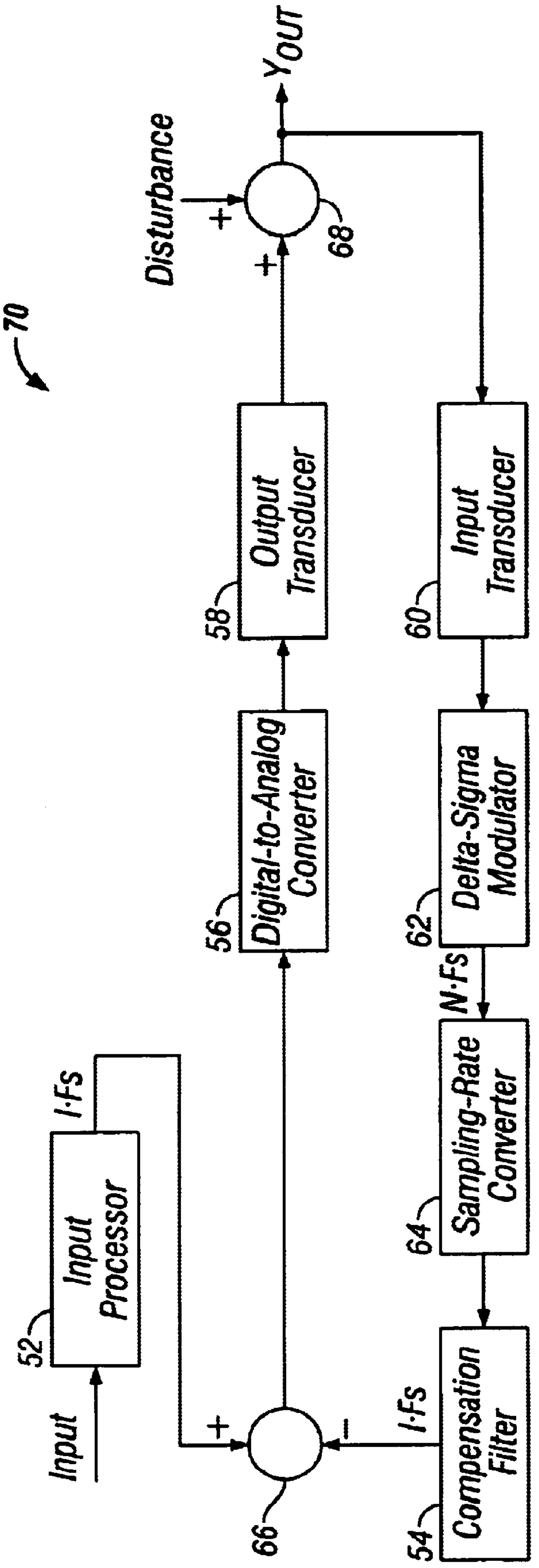
FIG. 5 is a block diagram of another exemplary embodiment of a feedback active noise cancellation system according to the present invention.

Turning now to FIG. 5, a block diagram of another exemplary embodiment of a feedback active noise cancellation system 70 according to the present invention is shown. The system 70 is essentially the same as the system 50 of FIG. 4 except that the compensation filter 54 has been moved from the forward path to the feedback path as shown. A whole array of block diagram manipulations are possible and well known to those of ordinary skill in the art. Any embodiment that can be the result of such manipulations is considered to be within the scope of the present invention as exemplified in FIGS. 4 and 5. Further such embodiments will not be presented in detail for the sake of brevity.

Figure 6:
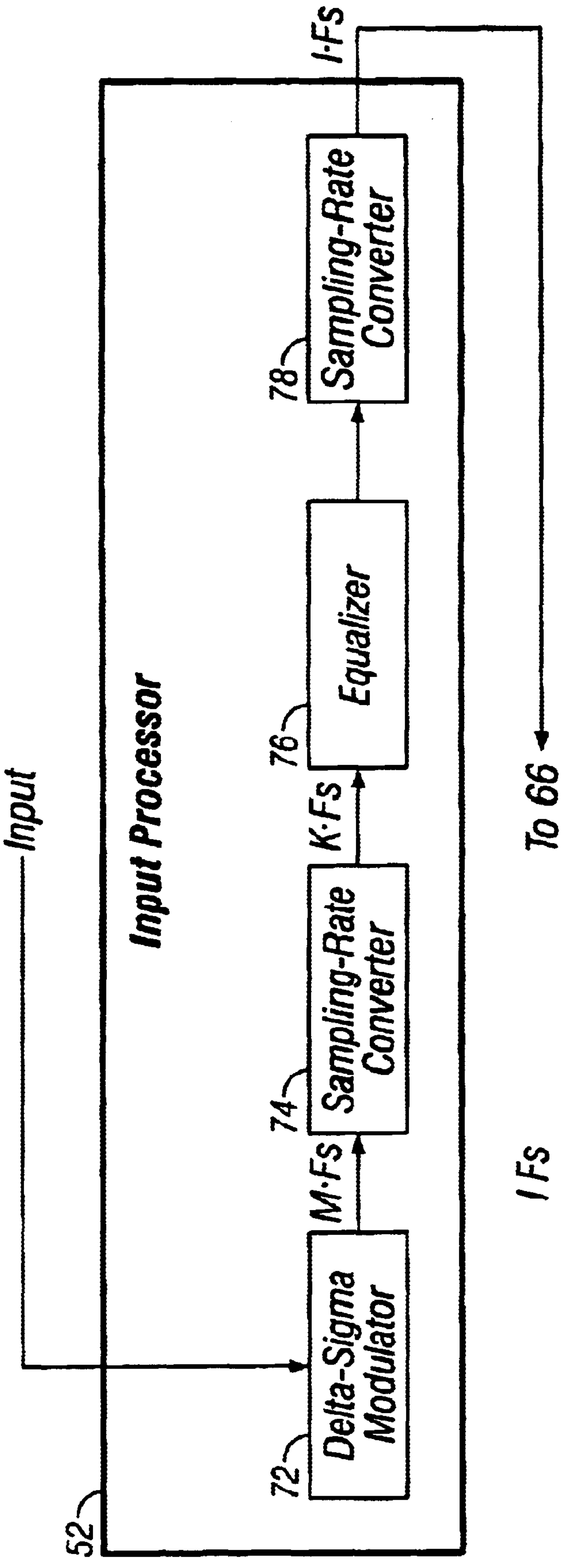
FIG. 6 is a block diagram of an exemplary embodiment of the input processor of FIGS. 4 and 5 according to the present invention.

Turning now to FIG. 6, a block diagram of an exemplary embodiment of the input processor 52 of FIGS. 4 and 5 according to the present invention is shown. Recall from above that the input processor 52 takes an INPUT signal, either analog or digital, and produces the processed digital input signal having the intermediate sampling rate (IFs). The elements of the input processor 52 will depend in part on the characteristics of the INPUT signal. Various combinations of elements will be outlined below as examples, but other combinations may be possible depending on design choice and circumstances. The example elements shown assume that the INPUT signal is an analog signal (Xin). The elements of the input processor may include an input delta-sigma modulator 72, a first input sampling-rate converter 74, an equalizer 76, and a second input sampling-rate converter 78. The output of the input delta-sigma modulator 72 has a sampling rate equal to M times Fs where M is greater than one and greater than 1. This output is then down-sampled by the first sampling-rate converter 74 to a rate equal to K times Fs. K is greater than or equal to one and less than I. Consequently, the output of the first sampling-rate converter

74 must later be up-sampled by the second input sampling-rate converter 78 to the intermediate sampling rate (IFs). Similar to above, it is also possible to combine the input delt-asigma modulator 72 and the first input sampling-rate converter 74 into an input ADC with an output rate of KFs. It is worth noting that M,.N, and K are not necessarily related to one another except that K is assumed to be less than M. M may or may not be equal to N. Also of note is the fact that the equalizer 76 is not in the critical delay path, that is, it is outside of the closed loop. As a result, either Finite Impulse Response (FIR) or Infinite Impulse Response (IIR) filters with higher order can be used to achieve better equalization. As an alternative to the example shown, it is possible that the first sampling-rate converter 74, either alone or as part of the input ADC, has an output rate equal to the intermediate sampling rate. In such a case, the second input sampling-rate converter 78 can be eliminated. In the latter case, the equalizer 76 may also be eliminated leaving only the input delta-sigma modulator 72 and the first input sampling-rate converter 74. Recall that the input delta-sigma modulator 72 and the first input sampling-rate converter 74 may also be replaced with the input ADC. If so, this would leave the input ADC as the only element of the input processor 52.

Rather than an analog signal, assume now that the INPUT signal is a digital signal (Din). If so, then there will be no need for the input delta-sigma modulator 72 and the first input sampling-rate converter 74 shown. These can be eliminated. That leaves the equalizer 76 and the second input sampling-rate converter 78. Of course since there is now only one, the term second could be dropped leaving only an input sampling-rate converter 78. Depending on the circumstances, these remaining two elements may appear in one of four configurations, that is, the one, the other, both, and neither. When the sampling rate of the digital signal is already at the intermediate rate, then there will be no need for the sampling-rate converter 78. When the sampling rate is not equal to the intermediate rate, then there will be a need for up-sampling or down-sampling, depending on the circumstances, by the input sampling-rate converter 78. Similarly, there may or may not bee a need or desire for equalization, depending on the circumstances, and when there is not then the equalizer 76 may be eliminated. It is therefore possible in a digital context that the input processor 52 may merely pass the signal through to the first summation node 66 of FIGS. 4 and 5 without transformation. Nevertheless, for the sake of uniformity, the signal is referred to as the processed digital input signal to distinguish it from the generalized INPUT signal which may or may not require transformation.

Other embodiments of the present invention include but are not limited to incorporation of programmable or adaptive equalizers and compensation filters, FIR and IIR, and associated hardware and software capabilities for achieving the same. It should be noted that the various features of the foregoing exemplary embodiments were discussed separately for clarity of description only and they can be incorporated in whole or in part into a single embodiment of the present invention having some or all of these features. It should also be noted that the present invention is not limited to active noise cancellation but can readily be used in conjunction with other signal processing devices such as communication systems having undesirable latencies.

Other embodiments, features, and advantages of the present invention will be apparent to those skilled in the art from a consideration of the foregoing specification as well as through practice of the invention and alternative embodiments and methods disclosed herein. Therefore, it should be emphasized that the specification and embodiments are exemplary only, and that the true scope and spirit of the invention is limited only by the claims.

What is claimed is:

1. A digital closed feedback loop having an input, an output, a first summation node, and a second summation node, wherein a processed digital input signal is fed to a first input of the first summation node, the processed digital input signal has an intermediate sampling rate, and a disturbance signal is fed to a first input of the second summation node, the digital closed feedback loop comprising:

a compensation filter having an input coupled to an output of the first summation node;

a digital-to-analog converter having an input coupled to an output of the compensation filter;

an output transducer having an input coupled to an output of the digital-to-analog converter and having an output coupled to a second input of the second summation node;

an input transducer having an input coupled to an output of the second summation node;

a delta-sigma modulator having an input coupled to an output of the input transducer, wherein the output signal of the delta-sigma modulator has a first sampling rate that is higher than the intermediate sampling rate; and a feedback sampling-rate converter having an input coupled to an output of the delt-asigma modulator and having an output coupled to a second input of the first summation node, wherein the output signal of the delta-sigma modulator is down-sampled from the first sampling rate to the intermediate sampling rate.

2. The digital closed feedback loop according to claim 1, further comprising an input processor for transforming an input signal into the processed digital input signal.

3. The digital closed feedback loop according to claim 2, wherein the input processor further comprises:

an input delta-sigma modulator having an input that receives the input signal, wherein the input signal is modulated to a second sampling rate that is higher than the intermediate sampling rate;

a first input sampling-rate converter having an input coupled to an output of the input delta-sigma modulator, wherein the second sampling rate is down-sampled to a third sampling rate; and an equalizer having an input coupled to an output of the first input sampling-rate converter.

4. The digital closed feedback loop according to claim 3, wherein the third sampling rate is equal to the intermediate sampling rate and the output signal from an output of the equalizer is the processed digital input signal.

5. The digital closed feedback loop according to claim 3, wherein the third sampling rate is less than the intermediate sampling rate and the input processor further comprises:

a second input sampling-rate converter having an input coupled to an output of the equalizer, wherein the third sampling rate is up-sampled to the intermediate sampling rate and the output signal from an output of the second input sampling-rate converter is the processed digital input signal.

6. The digital closed feedback loop according to claim 2, wherein the input processor further comprises:

an input delta-sigma modulator having an input that receives the input signal, wherein the input signal is modulated to a second sampling rate that is higher than the intermediate sampling rate; and an input sampling-rate converter having an input coupled to an output of the input delta-sigma modulator, wherein the second sampling rate is down-sampled to the intermediate sampling rate and the output signal from an output of the input sampling-rate converter is the processed digital input signal.

7. The digital closed feedback loop according to claim 2, wherein the input processor further comprises:

an equalizer having an input that receives the input signal and having an output that is the source of the processed digital input signal.

8. The digital closed feedback loop according to claim 2, wherein the input processor further comprises:

an equalizer having an input that receives the input signal; and an input sampling-rate converter having an input coupled to an output of the equalizer, wherein the input signal is converted from a second sampling rate to the intermediate sampling rate and the output signal from an output of the input sampling-rate converter is the processed digital input signal.

9. The digital closed feedback loop according to claim 2, wherein the input processor further comprises:

an input sampling-rate converter having an input that receives the input signal and having an output that is the source of the processed digital input signal, wherein the input signal is converted from a second sampling rate to the intermediate sampling rate.

10. A digital closed feedback loop having an input, an output, a first summation node, and a second summation node, wherein a processed digital input signal is fed to a first input of the first summation node, the processed digital input signal has an intermediate sampling rate, and a disturbance signal is fed to a first input of the second summation node, the digital closed feedback loop comprising:

a digital-to-analog converter having an input coupled to an output of the first summation node;

an output transducer having an input coupled to an output of the digital-to-analog converter and having an output coupled to a second input of the second summation node;

an input transducer having an input coupled to an output of the second summation node;

a delta-sigma modulator having an input coupled to an output of the input transducer, wherein the output signal of the delta-sigma modulator has a first sampling rate that is higher than the intermediate sampling rate;

a feedback sampling-rate converter having an input coupled to an output of the delta-sigma modulator, wherein the output signal of the delta-sigma modulator is down-sampled from the first sampling rate to the intermediate sampling rate; and a compensation filter having an input coupled to an output of the feedback sampling-rate converter and having an output coupled to a second input of the first summation node.

11. The digital closed feedback loop according to claim 10, further comprising an input processor for transforming an input signal into the processed digital input signal.

12. The digital closed feedback loop according to claim 11, wherein the input processor further comprises:

an input delta-sigma modulator having an input that receives the input signal, wherein the input signal is modulated to a second sampling rate that is higher than the intermediate sampling rate;

a first input sampling-rate converter having an input coupled to an output of the input delta-sigma modulator, wherein the second sampling rate is down-sampled to a third sampling rate; and an equalizer having an input coupled to an output of the first input sampling-rate converter.

13. The digital closed feedback loop according to claim 12, wherein the third sampling rate is equal to the intermediate sampling rate and the output signal from an output of the equalizer is the processed digital input signal.

14. The digital closed feedback loop according to claim 12, wherein the third sampling rate is less than the intermediate sampling rate and the input processor further comprises:

a second input sampling-rate converter having an input coupled to an output of the equalizer, wherein the third sampling rate is up-sampled to the intermediate sampling rate and the output signal from an output of the second input sampling-rate converter is the processed digital input signal.

15. The digital closed feedback loop according to claim 11, wherein the input processor further comprises:

an input delta-sigma modulator having an input that receives the input signal, wherein the input signal is modulated to a second sampling rate that is higher than the intermediate sampling rate; and an input sampling-rate converter having an input coupled to an output of the input delt-asigma modulator, wherein the second sampling rate is down-sampled to the intermediate sampling rate and the output signal from an output of the input sampling-rate converter is the processed digital input signal.

16. The digital closed feedback loop according to claim 11, wherein the input processor further comprises:

an equalizer having an input that receives the input signal and having an output that is the source of the processed digital input signal.

17. The digital closed feedback loop according to claim 11, wherein the input processor further comprises:

an equalizer having an input that receives the input signal; and an input sampling-rate converter having an input coupled to an output of the equalizer, wherein the input signal is converted from a second sampling rate to the intermediate sampling rate and the output signal from an output of the input sampling-rate converter is the processed digital input signal.

18. The digital closed feedback loop according to claim 11, wherein the input processor further conprises:

an input sampling-rate converter having an input that receives the input signal and having an output that is the source of the processed digital input signal, wherein the input signal is converted from a second sampling rate to the intermediate sampling rate.

19. A digital closed feedback loop method comprising:

processing an input signal into a processed digital input signal having a preselected intermediate sampling rate;

converting an analog output signal into a digital feedback signal having substantially the same preselected intermediate sampling rate;

combining the processed digital input signal and the digital feedback signal to form a combined digital signal;

generating a digital anti disturbance signal from the combined digital signal;

converting the digital anti disturbance signal to an analog anti disturbance signal; and combining the analog anti disturbance signal with a disturbance signal to form the analog output signal.

* * * * *

UNITED STATES PATENT AND TRADEMARK OFFICE

CERTIFICATE OF CORRECTION

PATENT NO. : 6,717,537 B1 
DATED : April 6, 2004
INVENTOR(S) : Xiaoling Fang, Keith L. Davis and Martin R. Johnson It is certified that error appears in the above-identified patent and that said Letters Patent is hereby corrected as shown below:

Column 1,
Line 29, after "a" insert -- wide variety of electro-optical manufacturing and circuit design configurations depending upon --.

Column 4,
Line 9, replace "(Finax)" with -- (F max) --.
Line 34, replace "(Vout)" with -- (Yout) --.

Column 5,
Line 4, replace "delt-asigma" with -- delta-sigma --.
Line 6, replace "M, .N," with -- M, N, --.

Column 6,
Line 30, replace "delt-asigma" with -- delta-sigma --.

Column 8,
Line 30, replace "delt-asigma" with -- delta-sigma --.
Line 53, replace "conprises:" with -- comprises --.

Signed and Sealed this

Twenty-second Day of February, 2005

JON W. DUDAS
*Director of the United States Patent and Trademark Office*